(12) United States Patent
Lee et al.

(10) Patent No.: US 8,821,740 B2
(45) Date of Patent: Sep. 2, 2014

(54) NANOWIRE MANUFACTURING METHOD

(75) Inventors: Young Jae Lee, Seoul (KR); Kyoung Jong Yoo, Seoul (KR); Jun Lee, Seoul (KR); Jin Su Kim, Seoul (KR); Jae Wan Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/130,146

(22) PCT Filed: Jun. 28, 2012

(86) PCT No.: PCT/KR2012/005116
§ 371 (c)(1),
(2), (4) Date: Dec. 30, 2013

(87) PCT Pub. No.: WO2013/002570
PCT Pub. Date: Jan. 3, 2013

(65) Prior Publication Data
US 2014/0144881 A1    May 29, 2014

(30) Foreign Application Priority Data
Jun. 29, 2011 (KR) .......................... 10-2011-0063528

(51) Int. Cl.
| B44C 1/22 | (2006.01) |
| C03C 15/00 | (2006.01) |
| C03C 25/68 | (2006.01) |
| C23F 1/00 | (2006.01) |

(52) U.S. Cl.
USPC .................................. 216/41; 216/2; 216/13

(58) Field of Classification Search
USPC .................................................. 216/41, 2, 13
See application file for complete search history.

(56) References Cited

U.S. PATENT DOCUMENTS

2004/0166233 A1 * 8/2004 Hong .............................. 427/58
2008/0318003 A1   12/2008 Chua et al.

FOREIGN PATENT DOCUMENTS

| KR | 10-2005-0099888 A | 10/2005 |
| KR | 10-2006-0018466 A | 3/2006 |

OTHER PUBLICATIONS

Morton, K.J et al. "Wafer-scale Patterning of sub-40 nm Diameter and High Aspect Ratio (>50:1) Silicon Pillar Arrays by Nanoimprint and Etching" Nano Technology. 2008, vol. 19, 345301 (6 pp.) Princeton.
International Search Report in International Application No. PCT/KR2012/005116, filed Jun. 28, 2012.

* cited by examiner

*Primary Examiner* — Roberts Culbert
(74) *Attorney, Agent, or Firm* — Saliwanchik, Lloyd & Eisenschenk

(57) ABSTRACT

Provided is a nanowire manufacturing method, comprising forming a plurality of grid patterns on a substrate, forming a nanowire on the grid patterns, and separating the grid pattern and the nanowire. According to the present invention, the width and height of the nanowire can be adjusted by controlling the wet-etching process time period, and the nanowire can be manufactured at a room temperature at low cost, the nanowire can be mass-manufactured and the nanowire with regularity can be manufactured even in case of mass production.

17 Claims, 7 Drawing Sheets

Fig. 1
(a)
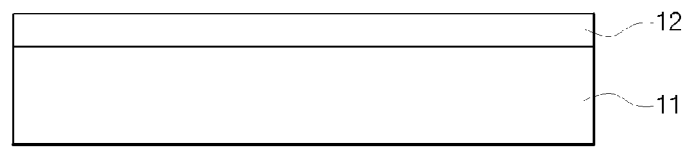
(b)
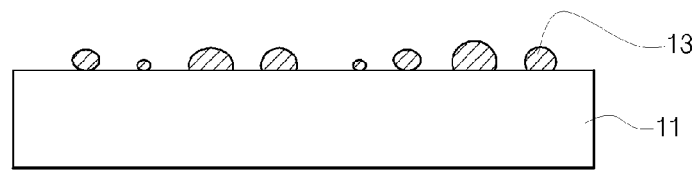
(c)
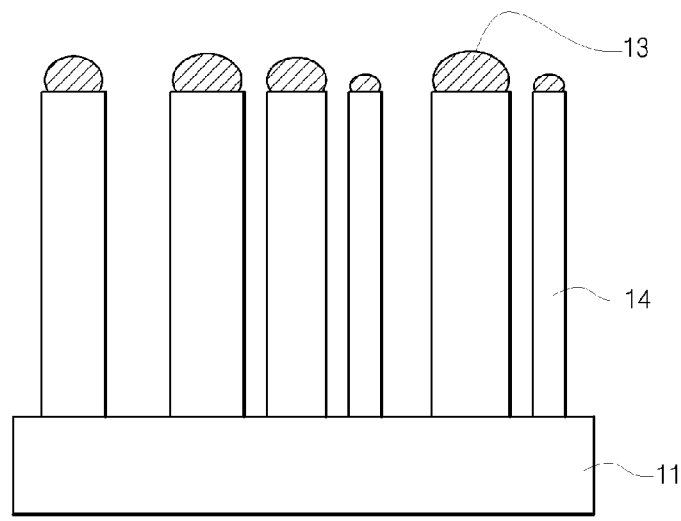
(d)

Fig. 2
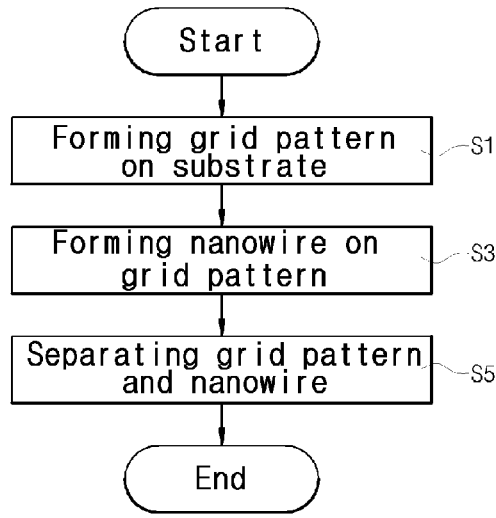
Fig. 3
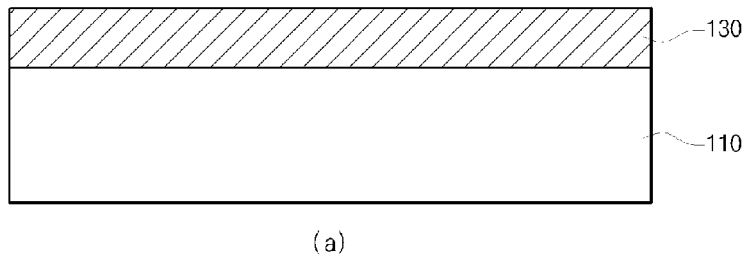
(a)
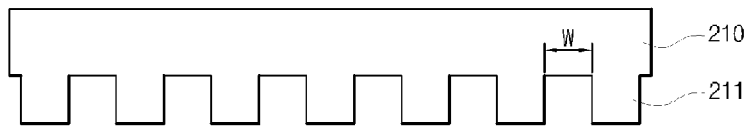
(b)
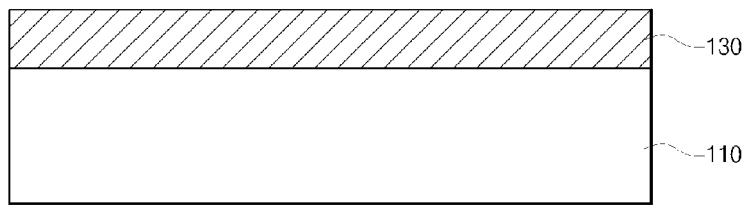
(c)

Fig. 5
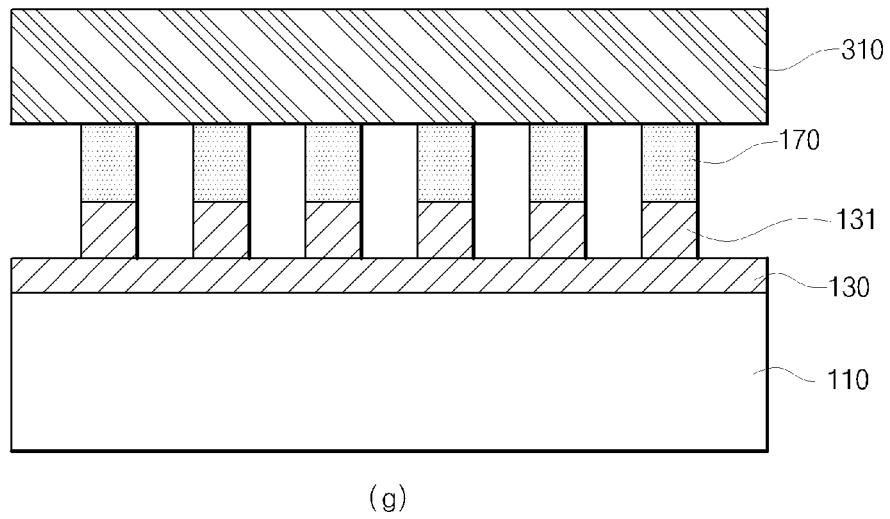
(g)
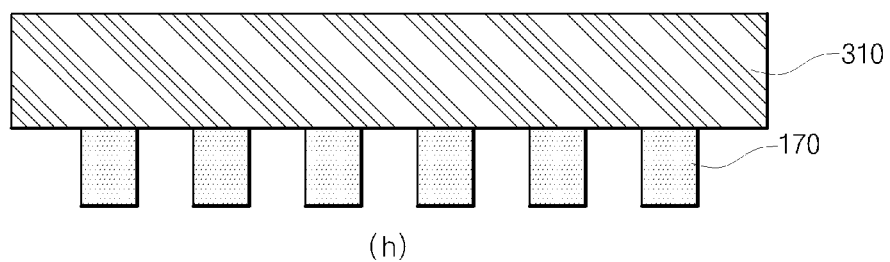
(h)
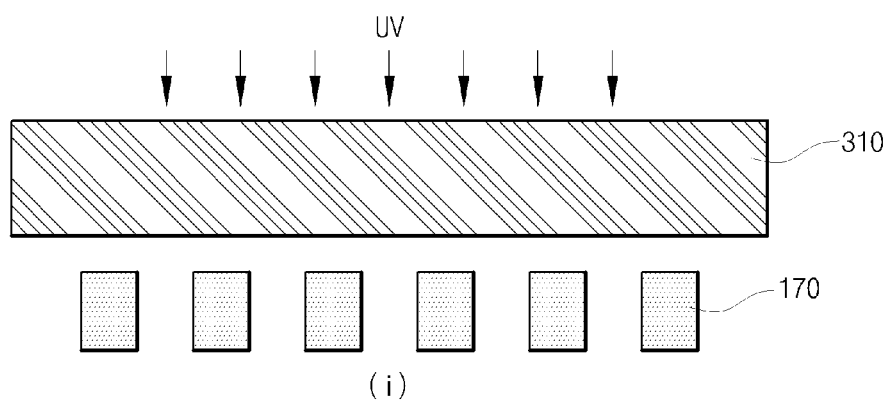
(i)

Fig. 6
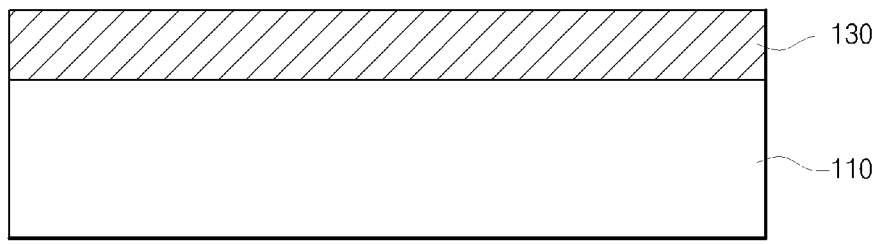
(a)
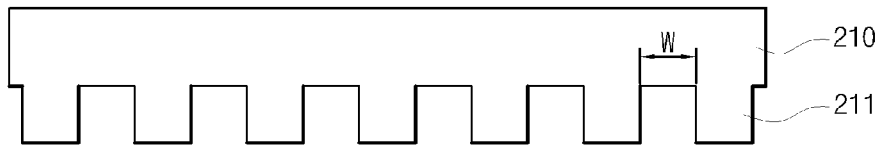
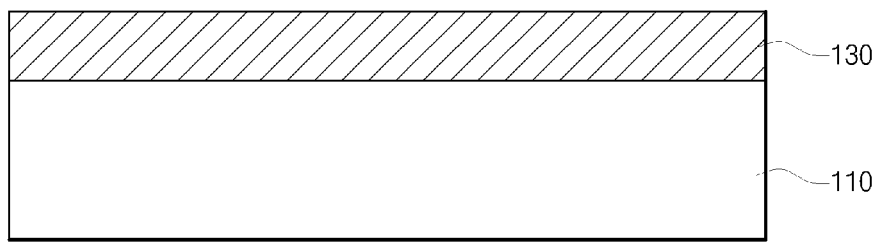
(b)
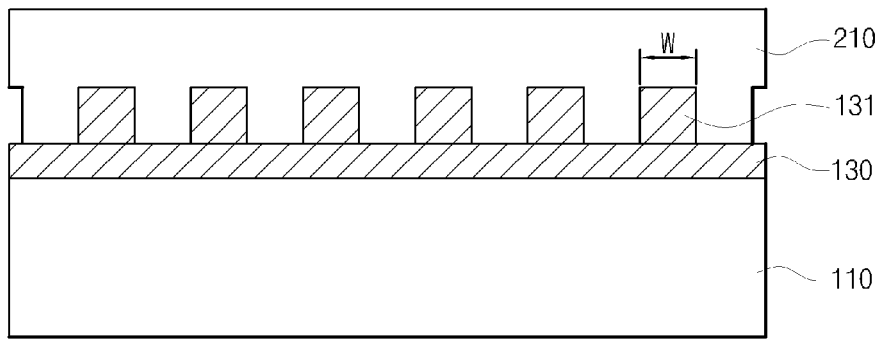
(c)

Fig. 8
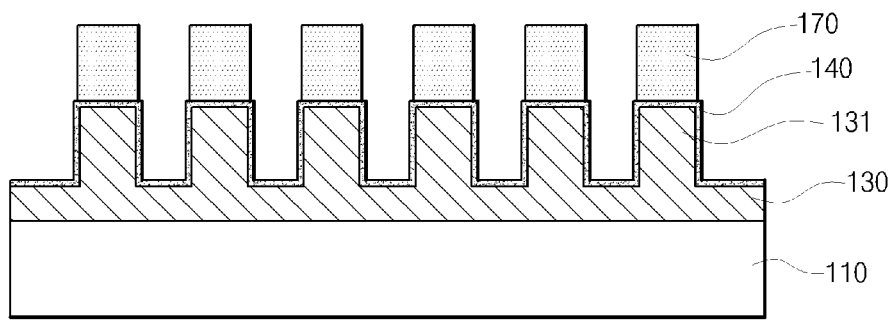
(g)
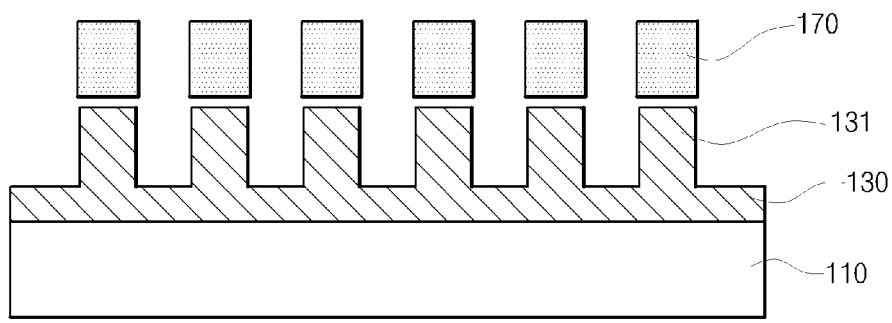
(h)

NANOWIRE MANUFACTURING METHOD

CROSS-REFERENCE TO RELATED APPLICATION

This application is the U.S. national stage application of International Patent Application No. PCT/KR2012/005116, filed Jun. 28, 2012, which claims priority to Korean Application No. 10-2011-0063528, filed Jun. 29, 2011, the disclosures of each of which are incorporated herein by reference in their entirety.

TECHNICAL FIELD

This application claims priority of Korean Patent Application No. 10-2011-0063528, filed on Jun. 29, 2011, in the Korean Intellectual Property Office, which is hereby incorporated by reference in its entirety.

The present invention relates to a nanowire manufacturing method.

BACKGROUND ART

A nanowire is a wire structure having a nanometer unit size wherein it has various diameter sizes of from less than 10 nm to several hundreds nm. In this nanowire, there are advantages such as an electron movement property depending on a specific direction or an optical property of a polarization phenomenon. As a result, the nanowire has been used in various fields of photo diode such as a laser, transistor and memory element, or the like as a next generation technology.

Currently, even though a study of a manufacturing method and material property for nano particles has been actively made, a study of a manufacturing method of nanowire has been minutely made. An existing representative nanowire manufacturing method is shown in FIG. 1 as a Vapor-Liquid-Solid (VLS) growth method.

The VLS growth method is used for manufacturing a nanowire as following steps. Firstly, a substrate 11 is prepared, as shown in FIG. 1(a), and then a metal layer 12 is formed on the substrate 11 by applying metal such as Au, as shown in FIG. 1(b). After that, the substrate provided with the metal layer is heat-treated at about 500° C. and then the substance on the metal layer 12 is agglomerated and as a result a metal catalyst 13 is formed, as shown in FIG. 1(C). At this time, the metal catalyst 13 each usually has irregular size, instead of regular size. After that, a nanowire 14 is formed based on the metal catalyst as a nucleation place, as shown in FIG. 1(d). Here, the nanowire 14 may be formed by supplying SiH4, or the like of silicon hydrogen compound to the metal catalyst 13 and inducing the Si element of SiH4 at a process temperature and at the metal catalyst place to form nucleus. When silane is supplied continuously thereto, the nanowire can growth continuously under the metal catalyst 13, as shown in FIG. 1(d). According to the VLS growth method, the nanowire may be formed in a desired length by adjusting properly the amount of material gas such as silane; however, there is a limitation to a maximum length when forming the nanowire, and further mass production is not proper since high temperature heat treatment is essential. Further, the nanowire growths under limitation to a diameter of the metal catalyst 13 and a distribution thereof wherein a precise width (thickness) and the distribution is difficult to be adjusted and impurity contamination may be made within the nanowire by the metal catalyst.

Additionally, the VLS growth method is high cost in process and is not proper for mass production, and thus the VLS growth method is not proper for mass production of the nanowire.

DISCLOSURE OF INVENTION

Technical Problem

An aspect of the present invention is directed to provide a nanowire manufacturing method capable of mass-producing the nanowire with high regularity at a room temperature at low cost by forming a plurality of grid patterns on a substrate, forming a nanowire on the grid patterns, and separating the grid pattern and the nanowire.

Solution to Problem

A nanowire manufacturing method for solving the drawbacks described in the forgoing according to the present invention comprises forming a plurality of grid patterns on a substrate, forming a nanowire on the grid patterns, and separating the grid pattern and the nanowire.

The forming a plurality of grid patterns comprises forming a grid base layer of polymer on the substrate, and compressing the grid base layer with an imprint mold.

A width of the grid pattern is 20-200 nm.

The forming a nanowire comprises forming a nanowire base layer by depositing nanowire material on the grid pattern, and wet-etching the nanowire base layer.

The nanowire material is at least one of metal, metal oxide, nitride and ceramic.

The depositing nanowire material is performed by using at least one of sputtering method, CVD, and evaporation method.

The separating the nanowire comprises separating the grid pattern and the nanowire by attaching adhesive agent on an upper part of the nanowire, an adhesion force of which is lost through UV, lighting UV to the adhesive agent to remove the adhesion force of the adhesive agent, and separating the adhesive agent and the nanowire, and the adhesive agent may be a film form.

The separating the nanowire comprises separating the grid pattern and the nanowire by applying ultrasound vibration to the grid pattern.

The nanowire manufacturing method further comprises forming a sacrificial layer by depositing sacrificial substance on the grid pattern, between the forming the grid pattern and the forming the nanowire, wherein the separating the nanowire comprises separating the grid pattern and the nanowire by etching the sacrificial layer.

Advantageous Effects of Invention

According to the present invention, a nanowire can be manufactured easily at a room temperature without a heat treatment process at a high temperature and thus process efficiency is improved.

Further, according to the present invention, the width and height of the manufactured nanowire can be adjusted by adjusting wet-etching time period.

Furthermore, according to the present invention, the nanowire is manufactured by using wet-etching process, and thus the nanowire can be manufactured at a low cost.

Meanwhile, according to the present invention, the nanowire can be mass-produced and the nanowire with high regularity can be manufactured even in case of mass production.

BRIEF DESCRIPTION OF DRAWINGS

The above and other aspects, features and advantages of certain exemplary embodiments of the present invention will be more apparent from the following description taken in conjunction with the accompanying drawings, in which:

FIG. 1 is a view showing a prior manufacturing method of nanowire;

FIG. 2 is a view showing a manufacturing method of the nanowire in order according to the present invention;

FIGS. 3 to 5 are views showing manufacturing process of the nanowire, respectively, according to the present invention; and FIGS. 6 to 8 are view showing a manufacturing process according to the present invention.

MODE FOR THE INVENTION

Figure 4:
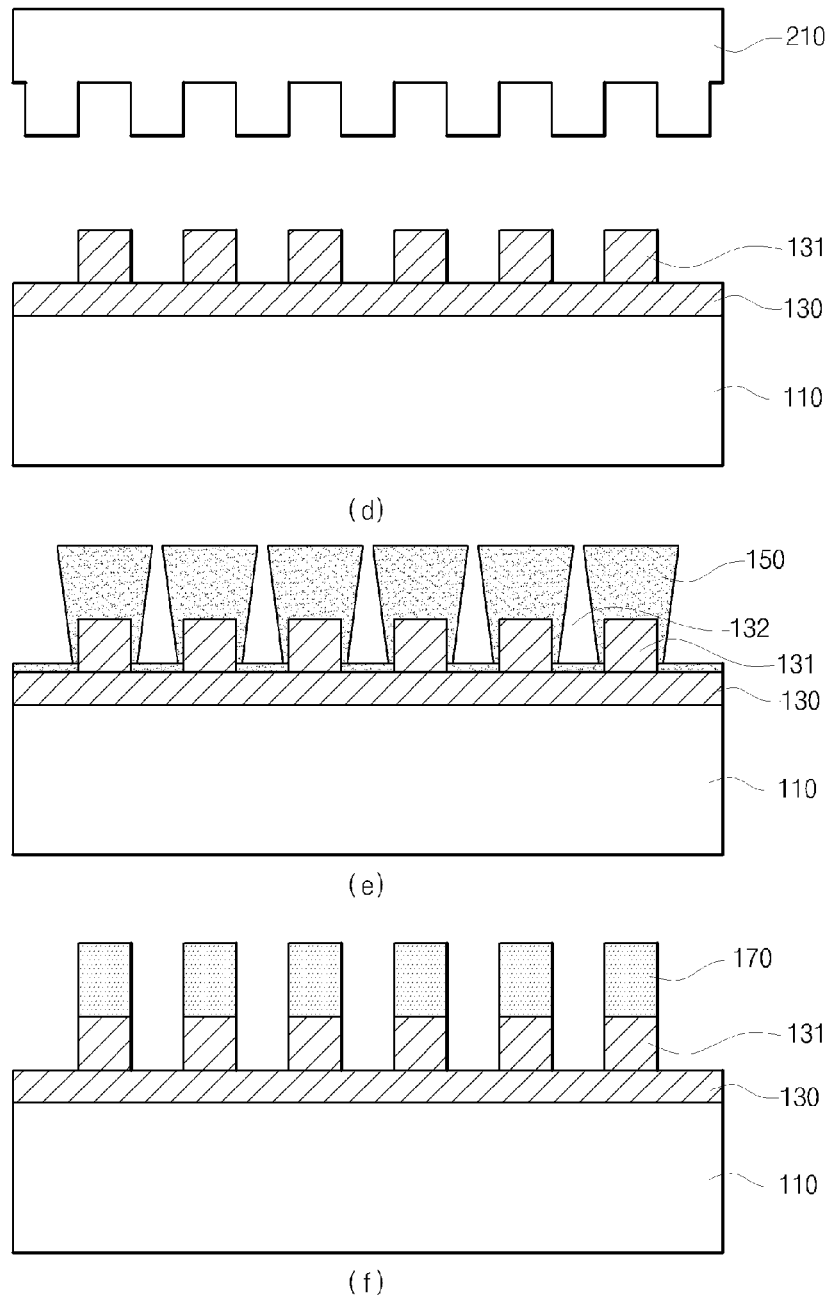

Hereinafter, exemplary embodiments of the present invention will be described with reference to the accompanying drawings. It should be understood that the configurations described herein and illustrated in the drawings are merely the embodiments of the present invention and may be replaced by various modifications as of the time when the application is filed. Further, in the following description of the present invention, a detailed description of known functions and configurations incorporated herein will be omitted when it may make the subject matter of the present invention rather unclear. The following terms are defined, considering their functions in the prevent invention, and should be construed based on the entire contents of the specification. The same or like reference numerals denote the element performing the same or like functions and operations through the specification.

FIG. 2 is a view showing a manufacturing method of the nanowire in order according to the present invention.

Referring to FIG. 2, a manufacturing method of a nanowire according to the present invention may includes steps of forming a plurality of grid patterns on a substrate (S1), forming a nanowire on the formed grid pattern (S3), and separating the grid pattern and the nanowire (S5).

As a substrate material used in S1 step, plastic comprising various polymers of glass, Quartz, acryl, PC and PET, or the like, and sapphire, or the like may be used, in addition to various material. Hereinafter, the process for forming a plurality of grid patterns will be described.

The grid pattern forming process may be performed by a nano-printing. That is, a grid base layer is formed by applying polymer such as UV resin on a substrate. In subsequent, an imprint mold having a groove and a protrusion are aligned over the grid base layer. Here, the plural grooves and protrusions of the imprint mold are spaced from each other at a predetermined distance and repeatedly aligned. Further, the groove of the imprint mold corresponds to a location where the grid pattern is to be formed.

After that, the groove of the imprint mold and the grid base layer are compressed to be contact and then photo-cured by lighting UV thereto. As a result, a plurality of grid patterns are formed a place over the substrate, corresponding to the groove of the imprint mold. At this time, a width (W) of the groove may be in a range of 20-200 nm, however, the width is not limited thereto. Accordingly, a width of the grid pattern to be formed at the place, corresponding to the groove is in a range of 20-200 nm. However, it is obvious that this is only an exemplary range and the width of the groove of the imprint mold and the width of the grid pattern may be selected in consideration of the width of the nanowire to be formed later.

Meanwhile, in the above embodiments, even the photo-curable material is used as the polymer forming the grid base layer, the heat-curable material may be used and at a result, the grid pattern according to the present invention may be formed by compressing the grid base layer with the imprint mold and heat-curing it.

The S3 step of forming the nanowire will be performed as followings.

A nanowire base layer may be formed by depositing the nanowire material on the grid pattern formed in S1 step through a sputtering method, CVD, and Evaporator, or the like, which are commercially used, and all implementable deposing methods which will be used depending on a future technology development. Here, the nanowire material may be at least one of metal, metal oxide, nitride and ceramic. For example, metal such as Ag, Cu, Al, Cr, or the like, metal oxide such as AgO, Al2O3, ZnO, ITO, or the like, and ceramic material such as Si or SiO2, SiN, SiC, or the like may be used as the nanowire material. However, these are exemplary material and further the scope of the present invention is not limited thereto, and thus various materials may be deposited on the grid pattern as the nanowire material depending on their using purposes.

After that, a nanowire may be formed by wet-etching the nanowire base layer formed by depositing the nanowire material. At this time, a width and thickness of the nanowire can be controlled by adjusting the wet-etching process time period.

In subsequent, in step S5, the nanowire formed in step S3 and the grid pattern are to be separated. At this time, the separation of the nanowire and the grid pattern is made as followings.

As a first embodiment in step S5, an adhesive agent is attached on the nanowire formed in step S3 to separate the nanowire from the grid pattern. At this time, the adhesive agent to be attached on the nanowire may be a film type or in liquid phase, and the film type may be more preferable. Further, the adhesive agent may be material that has a strong adhesion force before lighting UV, however, the adhesion force is to be lost when lighting UV. For example, photo-induced polymerization adhesive agent of acryl group or vinyl iso group may be used; however, the adhesive agent is not limited thereto, and all material having the above property may be used as the adhesive agent.

As a second embodiment in step S5, the nanowire and the grid pattern may be separated by apply ultrasound vibration to the grid pattern on which the nanowire is formed. At this time, in cases of the first and second embodiments, the grid pattern is surface-treated by applying lubricant agent on the grid pattern after Si step so that the grid pattern and the nanowire is separated easily.

Meanwhile, after S1 step, a sacrificial layer may be further deposited on the grid pattern, and in this case, as a third embodiment the grid pattern in step S5 and the nanowire is separated by etching the different kind film. The more detailed will be described, referring to FIGS. 6 to 8.

The nanowire manufacturing method according to the present invention, including the above method, has advantages such that the width and height of the nanowire can be adjusted by controlling the wet-etching process time period, differently from the prior art, and the nanowire can be manufactured at a room temperature at low cost, the nanowire can be mass-manufactured and the nanowire with regularity can be manufactured even in case of mass production. Further, the grid pattern which has been formed during the manufacturing process and formed on the substrate can be re-used for the nanowire manufacturing process and thereby saving a manufacturing cost.

FIGS. 3 to 5 are views showing manufacturing process of the nanowire, respectively, according to the present invention, in more detail, FIGS. 3 to 5 are views showing manufacturing processes of the nanowire according to the first embodiment described in FIG. 2.

Referring to FIGS. 2 to 5, a grid base layer 130 is formed by applying polymer on a substrate 110, as shown in FIG. 3(a).

In subsequent, an imprint mold 210 is aligned over the grid base layer 130, as shown in FIG. 3(b). Here, the imprint mold 210 has a plurality of protrusions 211 aligned at a predetermined distance and a plurality of grooves formed between the protrusions. Here, a width (W) of the groove may be in a range of 20-200 nm, however, the width is not limited thereto, as described in FIG. 2.

Furthermore, as shown in FIG. 3(c), the grid pattern 131 may be formed by compressing an upper part of the grid base layer 130 with the imprint mold 210, as shown in FIG. 3(c), and separating the imprint mold 210, as shown in FIG. 4(d). At this time, a photo-curing process may be performed through heat-curing process or UV lighting depending on the material kinds forming the grid base layer 130 after compressing the grid base layer 130 with the imprint mold 210 before separation.

After forming the grid pattern, as shown in FIG. 4(e), a nanowire base layer 150 may be formed by depositing the nanowire material on the grid pattern 131. At this time, the nano base layer 150 may be formed with a space 132 provided between the respective grid patterns 131, as shown in FIG. 4(e); however, the configuration of the nano base layer is not limited thereto. The reason for forming the space 132 between the grid patterns 131 is that the nanowire base layer 150 can be smoothly etched in a wet-etching process which will be performed later. Here, the nanowire material may be at least one of metal, metal oxide, nitride and ceramic, and a depositing method may include a sputtering method, CVD, and Evaporation method, or the like, which are commercially used, and all implementable deposing methods which will be used depending on a future technology development, as described in FIG. 2.

After forming the nanowire base layer 150, a nanowire 170 may be formed by wet-etching the space between the respective grid patterns 131, as shown in FIG. 4(f). At this time, a width and thickness of the nanowire 170 can be controlled by adjusting the wet-etching process time period.

After forming the nanowire 170, as shown in FIG. 5(g), an adhesive agent 310 is attached on the nanowire 170. At this time, the adhesive agent 310 may be a film type or in liquid phase, and the film type may be more preferable, and it is not limited thereto. Further, the adhesive agent may be material that has a strong adhesion force before lighting UV, however, the adhesion force is to be lost when lighting UV. For example, photo-induced polymerization adhesive agent of acryl group or vinyl iso group may be used; however, the adhesive agent is not limited thereto, and all material having the above property may be used as the adhesive agent.

After attaching the adhesive agent 310, as shown in FIG. 5(h), the nanowire 170 may be separated from the grid pattern, and by lighting UV to the adhesive agent and loosing the adhesion force of the adhesive agent 310, the nanowire according to the present invention is obtained, as shown in FIG. 5(i).

Figure 7:
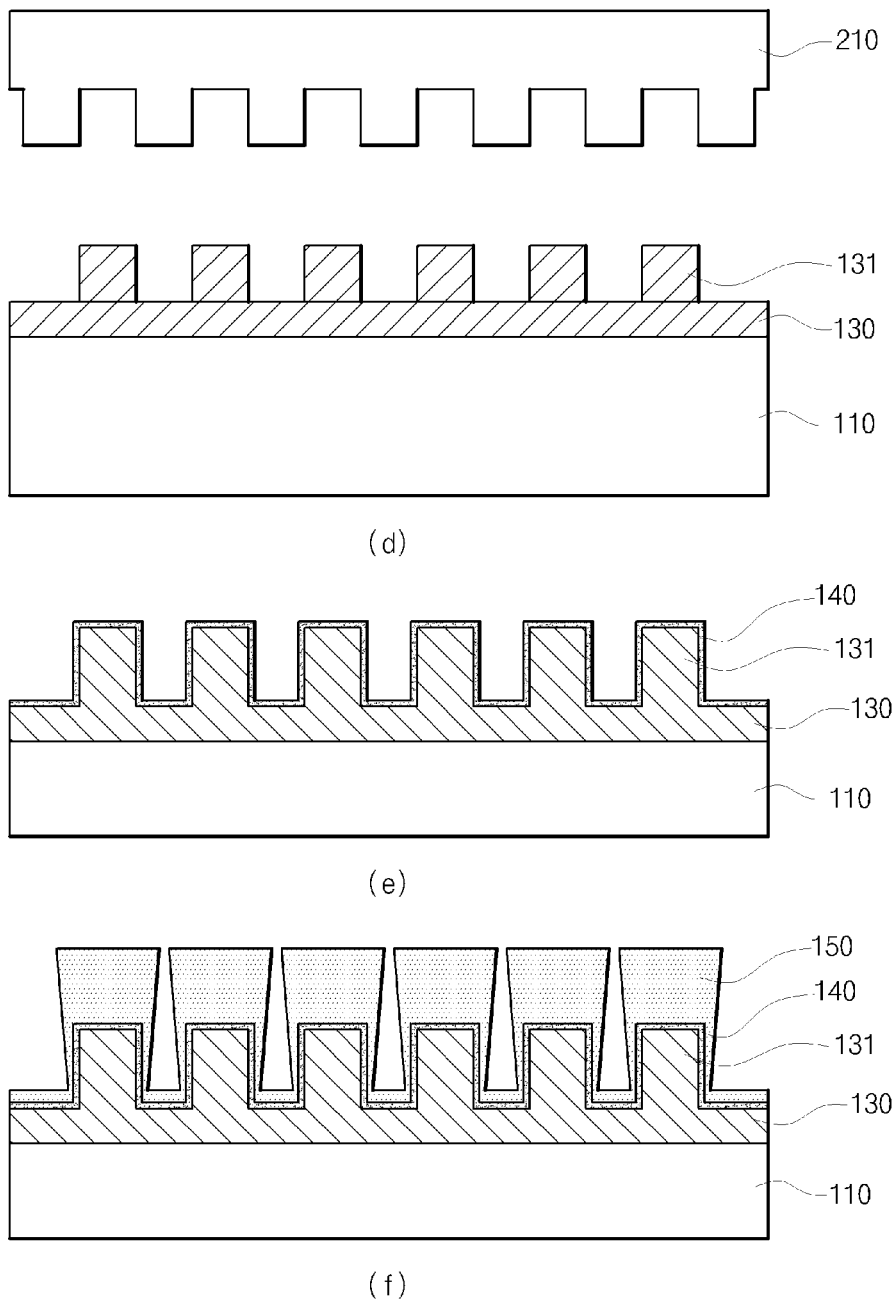

FIGS. 6 to 8 are view showing a manufacturing process according to the present invention, in more detail, FIGS. 6 to 8 are views showing manufacturing processes of the nanowire according to the third embodiment described in FIG. 2.

Referring to FIGS. 2 to 8, a grid base layer 130 is formed by applying polymer on a substrate 110, as shown in FIG. 6(a).

After that, an imprint mold 210 is aligned over the grid base layer 130, as shown in FIG. 6(b).

Further, as shown in FIG. 6(c), the grid pattern 131 may be formed by compressing an upper part of the grid base layer 130 with the imprint mold 210, and separating the imprint mold 210, as shown in FIG. 7(d). The more details are the same as in FIGS. 3 to 5, and thus will be omitted.

After forming the grid pattern, a sacrificial layer 140 may be formed on the grid pattern 131 by deposing the sacrificial layer substance. Here, the sacrificial layer substance may be varied depending on the nanowire material to be deposited later. For example, in case of one of Poly-Si, SiC, SiN, TiN, Ti and Al as the nanowire material, oxide may be used as the sacrificial layer substance. Further, in case of one of Oxide, SiC and SiN as the nanowire material, Poly-Si may be used as the sacrificial substance. Furthermore, in case of Ni as the nanowire material, Cu or Al may be used as the sacrificial substance, and in case of Ag as the nanowire material, Al may be used as the sacrificial substance. Meanwhile, in case of Au as the nanowire material, any one of Cu, Ni and Al may be used as the sacrificial substance. However, those are exemplary sacrificial substances and the sacrificial substance may be varied depending on the kinds of the nanowire materials.

After forming the sacrificial layer 140, as shown in FIG. 7(f), a nanowire base layer 150 may be formed by depositing the nanowire material on the grid pattern 131 on which the sacrificial layer is formed. At this time, the nano base layer 150 may be formed with a space 132 provided between the respective grid patterns 131, as shown in FIG. 7(f); however, the configuration of the nano base layer is not limited thereto, as described in FIG. 4.

Here, the nanowire material to be deposited on the grid pattern 131 may be at least one of metal, metal oxide, nitride and ceramic, and a depositing method may include a sputtering method, CVD, and Evaporation method, or the like, which are commercially used, and all implementable deposing methods which will be used depending on a future technology development, as described in FIG. 2.

After forming the nanowire base layer 150, a nanowire 170 may be formed by wet-etching the space between the respective grid patterns 131, as shown in FIG. 8(g).

After forming the nanowire 170, the sacrificial layer 140 is etched by using an etching agent, as shown in FIG. 8(h), to separate the grid pattern 131 and the nanowire 170 and as a result, the nanowire 170 is obtained. At this time, the etching agent may be varied depending on the kinds of the sacrificial substance.

According to the present invention, the nanowire can be manufactured through a nano imprinting and wet-etching process and thus it can be manufactured at a room temperature. Further, a width and height of the nanowire can be adjusted through a control of the wet-etching process time period. As a result, the nanowire of a desired size can be mass-manufactured and the nanowire with regularity can be produced even in case of mass production.

The invention claimed is:

1. A nanowire manufacturing method, comprising:
   forming a plurality of grid patterns on a substrate;
   forming a nanowire on the grid patterns; and
   separating the grid pattern and the nanowire.

2. The nanowire manufacturing method of claim 1, wherein the forming a plurality of grid patterns comprises forming a grid base layer of polymer on the substrate, and compressing the grid base layer with an imprint mold.

3. The nanowire manufacturing method of claim 1, wherein a width of the grid pattern is 20-200 nm.

4. The nanowire manufacturing method of claim 1, wherein the forming a nanowire comprises forming a nanowire base layer by depositing nanowire material on the grid pattern, and wet-etching the nanowire base layer.

5. The nanowire manufacturing method of claim 4, wherein the depositing nanowire material comprises proving a gap between the respective grid patterns.

6. The nanowire manufacturing method of claim 4, wherein the nanowire material is at least one of metal, metal oxide, nitride and ceramic.

7. The nanowire manufacturing method of claim 4, wherein the depositing nanowire material is performed by using at least one of sputtering method, CVD, and evaporation method.

8. The nanowire manufacturing method of claim 1, wherein the separating the nanowire comprises separating the grid pattern and the nanowire by attaching adhesive agent on an upper part of the nanowire, an adhesion force of which is lost through UV, lighting UV to the adhesive agent to remove the adhesion force of the adhesive agent, and separating the adhesive agent and the nanowire.

9. The nanowire manufacturing method of claim 1, wherein the separating the nanowire comprises separating the grid pattern and the nanowire by applying ultrasound vibration to the grid pattern.

10. The nanowire manufacturing method of claim 1, further comprises forming a sacrificial layer by depositing sacrificial substance on the grid pattern, between the forming the grid pattern and the forming the nanowire, wherein the separating the nanowire comprises separating the grid pattern and the nanowire by etching the sacrificial layer.

11. The nanowire manufacturing method of claim 10, wherein the sacrificial layer substance is one of Oxide, Poly-Si, Cu, Al, and Ni.

12. The nanowire manufacturing method of claim 11, wherein in case of Oxide as the sacrificial layer substance, the nanowire is made of one of Poly-Si, SiC, SiN, TiN, Ti and Al.

13. The nanowire manufacturing method of claim 11, wherein in case of Poly-Si as the sacrificial layer substance, the nanowire is made of one of Oxide, SiC and SiN.

14. The nanowire manufacturing method of claim 11, wherein in case of Al as the sacrificial layer substance, the nanowire is made of one of Ni, Ag, and Au.

15. The nanowire manufacturing method of claim 11, wherein in case of Cu as the sacrificial layer substance, the nanowire is made of Ni or Au.

16. The nanowire manufacturing method of claim 11, wherein in case of Ni as the sacrificial layer substance, the nanowire is made of Au.

17. The nanowire manufacturing method of claim 11, wherein in the sacrificial layer substance and the nanowire are made of different materials.

* * * * *